(12) United States Patent
Miura et al.

(10) Patent No.: US 9,094,005 B2
(45) Date of Patent: Jul. 28, 2015

(54) SEMICONDUCTOR ELEMENT MODULE AND GATE DRIVE CIRCUIT

(71) Applicant: DENSO CORPORATION, Kariya, Aichi-pref. (JP)

(72) Inventors: Ryotaro Miura, Nagoya (JP); Takashi Gotou, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/332,761

(22) Filed: Jul. 16, 2014

(65) Prior Publication Data

US 2015/0035569 A1    Feb. 5, 2015

(30) Foreign Application Priority Data

Jul. 30, 2013 (JP) ................... 2013-157722
Jan. 27, 2014 (JP) ................... 2014-012410

(51) Int. Cl.
*H03K 3/00* (2006.01)
*H03K 17/081* (2006.01)
*H03K 17/16* (2006.01)

(52) U.S. Cl.
CPC ........ *H03K 17/08112* (2013.01); *H03K 17/167* (2013.01); *H03K 17/168* (2013.01)

(58) Field of Classification Search
USPC ........................................................ 327/109
See application file for complete search history.

(56) References Cited

U.S. PATENT DOCUMENTS

| | | | | |
|---|---|---|---|---|
| 5,142,171 A | * | 8/1992 | Nunogawa et al. | ........... 327/110 |
| 2005/0206438 A1 | | 9/2005 | Higashi | |
| 2007/0115038 A1 | | 5/2007 | Higashi et al. | |

FOREIGN PATENT DOCUMENTS

| | | |
|---|---|---|
| JP | 2004-187463 A | 7/2004 |
| JP | 2008-054098 A | 3/2008 |
| JP | 2008-086068 A | 4/2008 |
| JP | 2011-103756 A | 5/2011 |
| JP | 2013-042613 A | 2/2013 |

* cited by examiner

*Primary Examiner* — Daniel Puentes
(74) *Attorney, Agent, or Firm* — Posz Law Group, PLC

(57) ABSTRACT

A semiconductor element module includes a driving element and a voltage change detecting element each formed of a voltage driving semiconductor element. The voltage change detecting element detects a change of a voltage between a collector and an emitter or between a drain and a source of the driving element. A collector or a drain of the voltage change detecting element is connected to the collector or the drain of the driving element, and a gate of the voltage change detecting element is connected to an emitter or a source of the voltage change detecting element. The emitter or the source of the voltage change detecting element is provided as a detecting terminal.

6 Claims, 14 Drawing Sheets

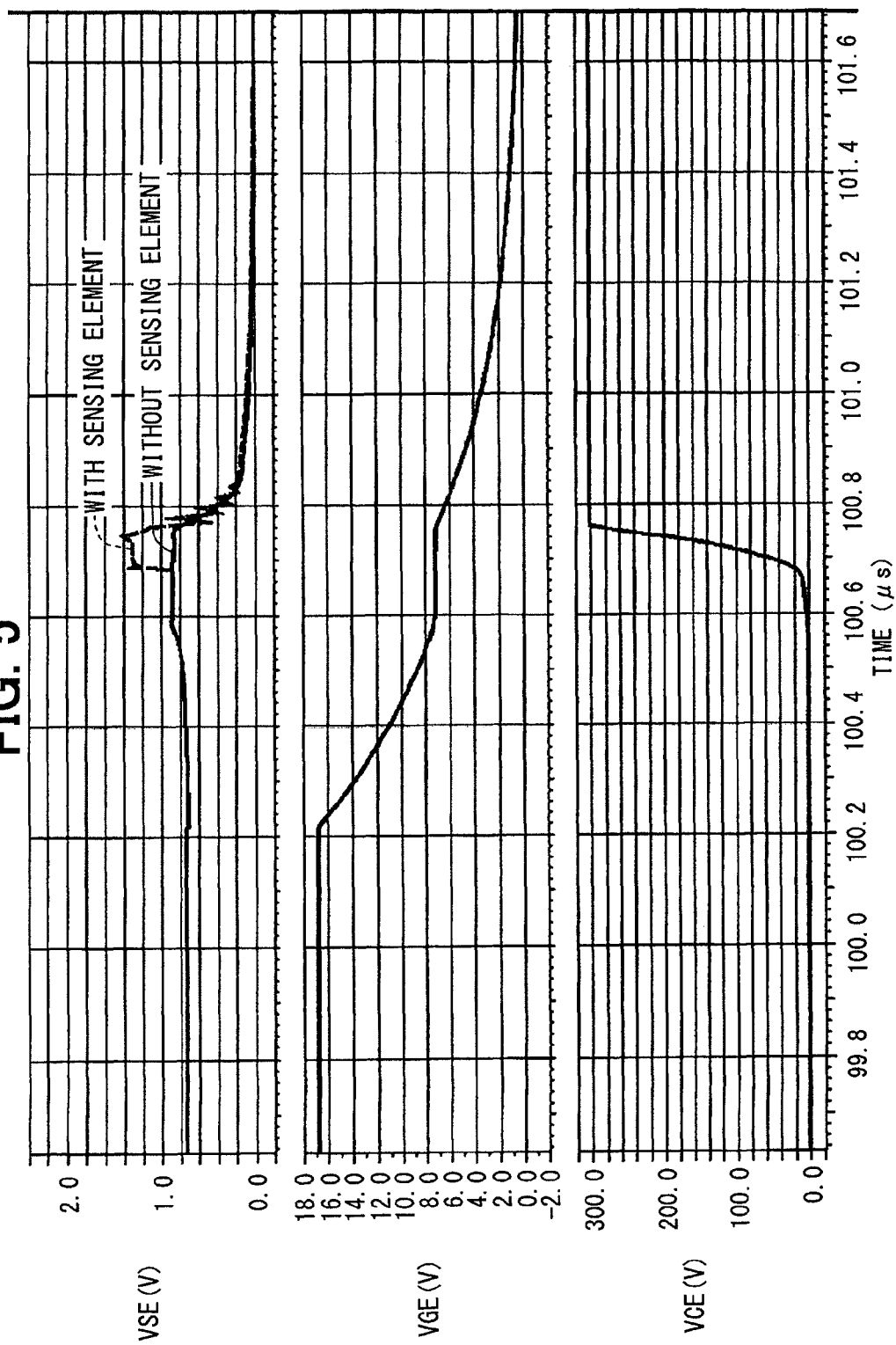

SEMICONDUCTOR ELEMENT MODULE AND GATE DRIVE CIRCUIT

CROSS REFERENCE TO RELATED APPLICATIONS

The present application is based on and claims priority to Japanese Patent Application No. 2013-157722 filed on Jul. 30, 2013 and Japanese Patent Application No. 2014-12410 filed on Jan. 27, 2014, the contents of which are incorporated in their entirety herein by reference.

TECHNICAL FIELD

The present disclosure relates to a semiconductor element module and a gate drive circuit connected to the semiconductor element module.

BACKGROUND

In a drive control of an insulated gate bipolar transistor (IGBT), which is a kind of voltage driving semiconductor element, there is a technique of applying a gate voltage while monitoring a voltage between a collector and an emitter for reducing a switch loss generated at turning-off. For example, in JP-A-2011-103756 (hereafter, referred to as a patent document 1), a gate of an IGBT is divided into a driving gate and a detecting gate, and a collector voltage detection circuit detects a collector voltage using a parasitic capacitance between the detecting gate and the collector. According to this configuration, the collector voltage can be detected without connecting an element, such as a resistance element or a capacitor, to the collector at outside of an IGBT module.

The patent document 1 further discloses a configuration in which a voltage between the collector and the emitter is divided between the parasitic capacitance and a capacitance of a capacitor by connecting the capacitor between the detecting gate and the ground, and a divided potential is detected by a gate drive circuit. According to this configuration, a circuit element of high breakdown voltage is unnecessary to the gate drive circuit.

In the configuration in the patent document 1, a charge of the parasitic capacitance is transferred to a capacitor in a collector voltage detection circuit, a change of charges in the capacitor is reflected to an output voltage of an operational amplifier, and the output voltage is output to a gate drive control circuit. In this configuration, it is practically difficult to change the driving state of the gate drive control circuit by the voltage output from the collector voltage detection circuit to restrict a surge voltage and to reduce a switching loss during a switching operation of the IGBT because of a delay in response. The patent document 1 fails to disclose a timing diagram indicating how to change the gate voltage of the IGBT by operations of the collector voltage detection circuit and the gate drive control circuit.

Furthermore, in the above-described configuration, it is preferable that a ratio of the parasitic capacitance and the capacitance of an external element is constant for detecting the voltage between the collector and the emitter with accuracy. However, in the configuration of the patent document 1, there are manufacturing variations and difference of temperature characteristics between the parasitic capacitance and an external capacitor. In addition, there is a considerable temperature difference between the IGBT including the parasitic capacitance and a control substrate on which the collector voltage detection circuit including the capacitor is disposed in an operating environment, and a variation of the capacitance ratio tends to be large. Furthermore, because the gate and the emitter are separated, a detecting element may be erroneously turned on.

SUMMARY

It is an object of the present disclosure to provide a semiconductor element module and a gate drive circuit that can detect a change of a voltage between a collector and an emitter or between a drain and a source of the driving element with a high accuracy and can reduce a surge voltage generated when the driving element is turned off.

A semiconductor element module according to a first aspect of the present disclosure includes a driving element formed of a voltage driving semiconductor element and a voltage change detecting element formed of a voltage driving semiconductor element. The voltage change detecting element detects a change of a voltage between a collector and an emitter or between a drain and a source of the driving element. A collector or a drain of the voltage change detecting element is connected to the collector or the drain of the driving element, and a gate of the voltage change detecting element is connected to an emitter or a source of the voltage change detecting element. The emitter or the source of the voltage change detecting element is provided as a detecting terminal.

A gate drive circuit according to the first aspect is to be connected with the semiconductor element module and to transmit a drive signal to the gate of the driving element. The gate drive circuit includes a detecting resistor, a switching speed changeable section, and a switching speed control section. The detecting resistor is to be connected between the detecting terminal and the emitter or the source of the driving element. The switching speed changeable section is capable of changing a switching speed of the driving element. The switching speed control section controls the switching speed changeable section to set the switching speed to be high when a turning-off of the driving element is started and to set the switching speed to be low when a change of a terminal voltage of the detecting resistance element is detected.

The semiconductor element module and the gate drive circuit according to the first aspect can detect a change of the voltage between the collector and the emitter or between the drain and the source of the driving element with a high accuracy and can reduce a surge voltage generated when the driving element is turned off.

A semiconductor element module according to a second aspect of the present disclosure includes a driving element formed of a voltage driving semiconductor element, and a plurality of voltage change detecting elements each formed of a voltage driving semiconductor element. The voltage change detecting elements are connected in series to form a series circuit. The gate of each of the voltage change detecting elements is connected to an emitter or a source of each of the voltage change detecting elements. The series circuit is connected in parallel with the driving element. At least one common connection point in the series circuit is provided as a detecting terminal for detecting a change of a voltage between a collector and an emitter or between a drain and a source of the driving element.

A gate drive circuit according to the second aspect is to be connected with the semiconductor element module and to transmit a drive signal to the gate of the driving element. The gate drive circuit includes a switching speed changeable section and a switching speed control section. The switching speed changeable section is capable of changing a switching speed of driving element. The switching speed control section controls the switching speed changeable section to set the switching speed to be high when a turning-off of the driving element is started and to set the switching speed to be low when a change of a voltage of the detecting terminal of the semiconductor element module is detected.

The semiconductor element module and the gate drive circuit according to the first aspect can detect a change of the voltage between the collector and the emitter or between the drain and the source of the driving element with a high accuracy and can reduce a surge voltage generated when the driving element is turned off.

BRIEF DESCRIPTION OF THE DRAWINGS

Additional objects and advantages of the present disclosure will be more readily apparent from the following detailed description when taken together with the accompanying drawings. In the drawings:

FIG. 5 is a diagram illustrating a simulation result of waveforms when a driving element is turned off;

DETAILED DESCRIPTION (First Embodiment)

Figure 1:
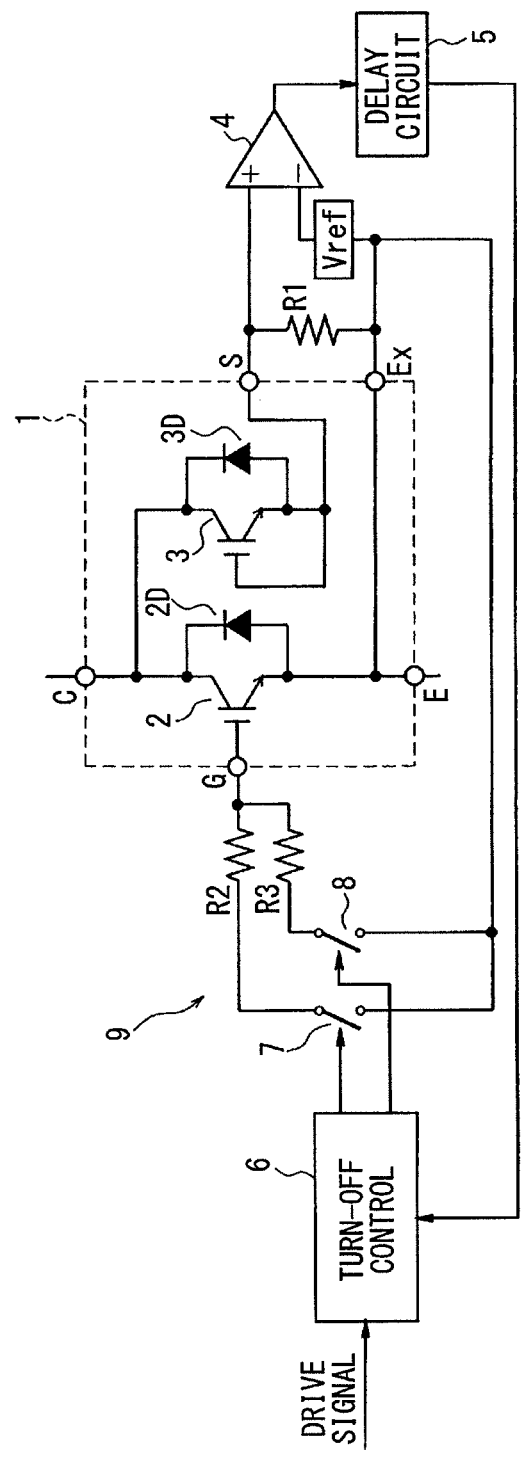
FIG. 1 is a diagram illustrating a semiconductor element module and a gate drive circuit according to a first embodiment of the present disclosure.

A semiconductor element module 1 according to a first embodiment of the present disclosure will be described with reference to FIG. 1. The semiconductor element module 1 includes a driving element 2 and a voltage change sensing element 3. The voltage change sensing element 3 can work as a voltage change detecting element. Each of the driving element 2 and the voltage change sensing element 3 is, for example, an IGBT. The IGBT is an example of a voltage driving semiconductor element. The driving element 2 and the voltage change sensing element 3 are formed in one IC chip by the same process. The voltage change sensing element 3 has a dimension smaller than the driving element 2. Between a collector and an emitter of the driving element 2, a free wheel diode 2D is connected. Between a collector and an emitter of the voltage change sensing element 3, a freewheel diode 3D is connected.

A gate (conduction control terminal), the collector (conduction terminal), and the emitter (reference-potential side conduction terminal) of the driving element 2 are respectively connected to external terminals G, C, E of the semiconductor element module 1. The collector of the voltage change sensing element 3 is connected to the external terminal C, and a gate and the emitter of the voltage change sensing element 3 are connected to an external terminal S (detecting terminal) of the semiconductor element module 1.

At outside of the semiconductor element module 1, a resistance element R1 is connected between the external terminal S and an external terminal Ex. The resistance element R1 can work as a detecting element and a voltage change detecting element. Because the external terminal Ex is substantially the same terminal as the external terminal E, it is not always necessary to provide the external terminal Ex independently from the external terminal E. The external terminal S is connected to an inverting input terminal of a comparator 4. A non-inverting input terminal of the comparator 4 is applied with a reference voltage Vref. A reference potential of the reference voltage Vref is the external terminal Ex (circuit ground).

An output terminal of the comparator 4 is connected to an input terminal of a turn-off control portion 6 through a delay circuit 5. The turn-off control portion 6 can work as a switching speed control section. Between the external terminal G and the external terminal Ex of the semiconductor element module 1, a series circuit of a resistance element R2 and a switch 7 and a series circuit of a resistance element R3 and a switch 8 are connected in parallel with each other. The series circuit of the resistance element R2 and the switch 7, and the series circuit of the resistance element R3 and the switch 8 can work as a switching speed changeable section.

The turn-off control portion 6 receives a drive signal (gate control signal) of the driving element 2. When the drive signal is at a low level and an output voltage of the comparator 4 is at a high level, the switch 7 and the switch 8 are turned on at the same time. When the drive signal is at the low level and the output voltage of the comparator 4 is at the low level, only the switch 7 is turned on. The above-described components except for the semiconductor element module 1 form a gate drive circuit 9. In the gate drive circuit 9, only components for turning off the driving element 2 are illustrated. When turning on the driving element 2, a high level signal is applied to the external terminal G through a signal path, which is not illustrated. At this time, both of the switches 7, 8 are turned off.

Figure 2:
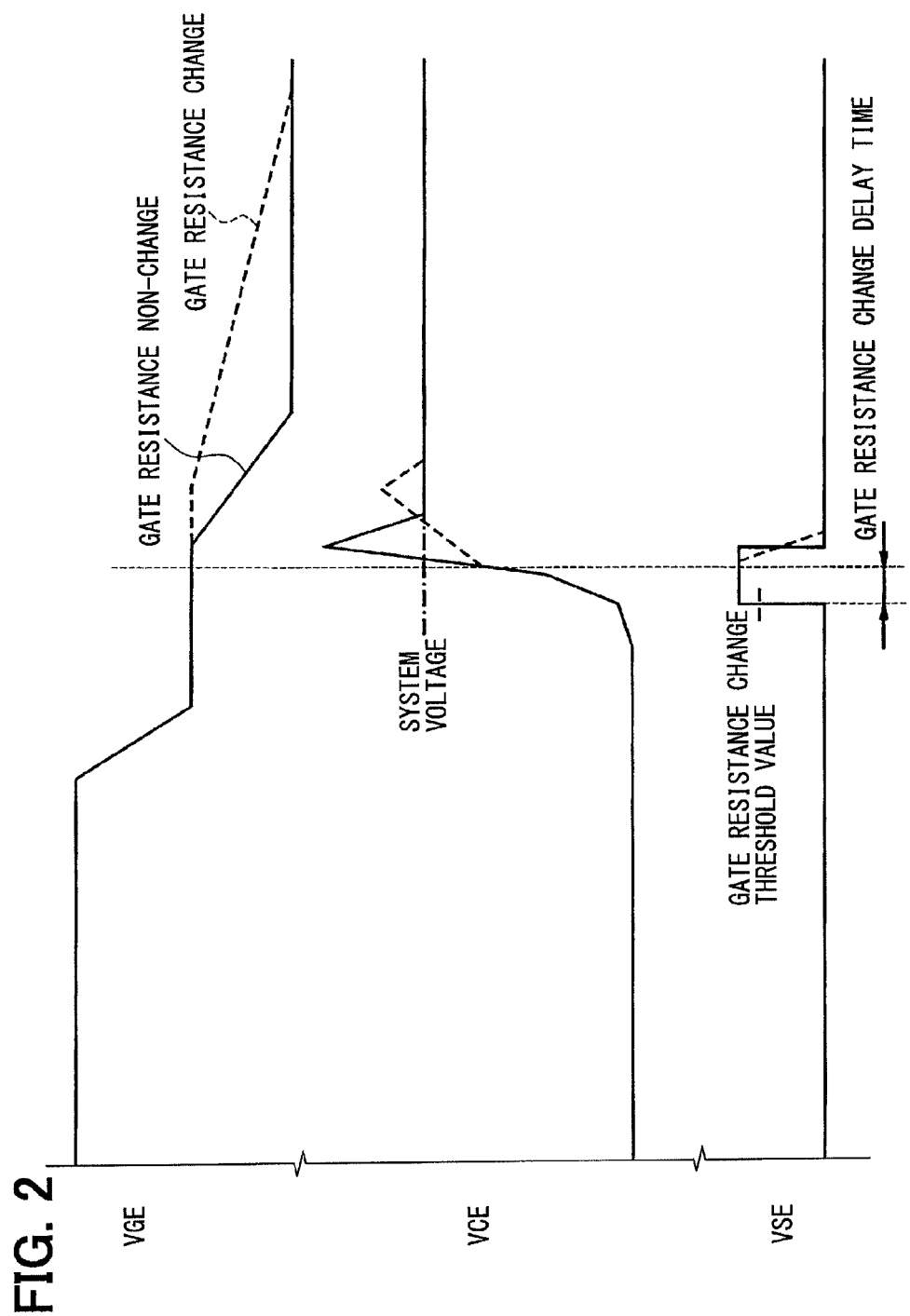
FIG. 2 is a timing diagram illustrating voltage waveforms when a driving element is turned off.

Next, an operation of the semiconductor element module 1 will be described with reference to FIG. 2. FIG. 2 shows a voltage VGE between the gate and the emitter, a voltage VCE between the collector and the emitter, and a voltage VSE between the sensing terminal S and the emitter when the driving element 2 in the semiconductor element module 1 is turned off. In the middle of changing the voltage VGE from a high level to a low level, a waveform the voltage VGE becomes almost flat in a mirror region where a mirror effect works. After that, the driving element 2 starts to be turned off, the voltage VCE increases, and finally, the voltage VCE reaches a power supply voltage (system voltage) applied to the collector.

In the above-described process, if the parallel circuit of the resistance elements R2, R3 is consistently connected between the terminals G, Ex of the semiconductor element module 1, the voltage VCE changes as shown by the solid line. Then, when the driving element 2 is completely turned off, a surge voltage is generated at the collector by an inductance component.

On the other hand, in a process of increasing the voltage VCE by the gate drive circuit 9, a positive voltage change (dv/dt) is generated between the collector and the emitter. Due to the voltage change, electric current flows between both terminals through parasitic capacitances between the collector and the gate and between the collector and the emitter of the voltage change sensing element 3, and the electric current flows from the gate and the emitter of the voltage change sensing element 3 to the resistance element R1 through the terminal S. Accordingly, when the terminal voltage of the resistance element R1 increases and exceeds the reference voltage Vref, the output voltage of the comparator 4 changes to the low level. Then, the turn-off control portion 6 turns off the switch 8. After that, the gate of the driving element 2 is discharged only through the resistance element R2.

In other words, a resistance value of path for discharging the gate increases in the process of turning off the driving element 2, and the switching speed decreases. Due to the above-described action, a gradient of decrease of the voltage VGE becomes gentle, and a change of the voltage VCE is moderated, an amplitude of the surge voltage is reduced as shown by a dashed line. Due to the above-described operation, a falling gradient of the waveform of the voltage VSE also becomes gentle. A delay time provided by the delay circuit 5 is set in consideration of a time for effectively restricting the surge voltage by switching the gate resistance value just before the voltage VCE reaches the power supply voltage after the output voltage of the comparator 4 changes to the low level.

According to the present embodiment, the voltage change sensing element 3 is provided to detect a change of the voltage between the collector and the emitter of the driving element 2, the collector of the voltage change sensing element 3 is connected to the collector of the driving element 2, and the gate of the voltage change sensing element 3 is connected to the emitter of the voltage change sensing element 3. The emitter of the voltage change sensing element 3 is used as the detecting terminal S of the semiconductor element module 1. Accordingly, when the gate voltage is reduced, the driving element 2 starts to be turned off, and the voltage between the collector and the emitter increases, a positive voltage change (dv/dt) is generated between the collector and the emitter. Due to the voltage change, electric current flows between the both terminals through the parasitic capacitances between the collector and the gate and between the collector and the emitter of the voltage change sensing element 3.

Because the above-described current can be detected by disposing the resistance element R1 between the detecting terminals S and Ex, the change of the voltage between the collector and the emitter in the process of turning off the driving element 2 can be rapidly detected by monitoring the change of the terminal voltage of the resistance element R1. Thus, when the gate voltage of the driving element 2 is changed in accordance with the change of the voltage between the collector and the emitter, a surge voltage generated at the collector when the driving element 2 is turned off can be reduced with certainty.

In the present embodiment, the above-described element structure is employed, and the gate of the voltage change sensing element 3 is connected to the emitter of the voltage change sensing element 3. Thus, in the process of turning-off, the voltage change sensing element 3 is certainly prevented from being turned on.

At a time when the driving element 2 starts to be turned off, the turn-off control portion 6 in the gate drive circuit 9 decreases the gate resistance value to increase the switching speed. When the turn-off control portion 6 detects that the terminal voltage of the resistance element R1 changes while the driving element 2 is tuned off, the turn-off control portion 6 increases the gate resistance value to decrease the switching speed. Accordingly, the switching speed can be reduced while the driving element 2 is turned off, and the surge voltage can be reduced.

(Second Embodiment)

Figure 3:
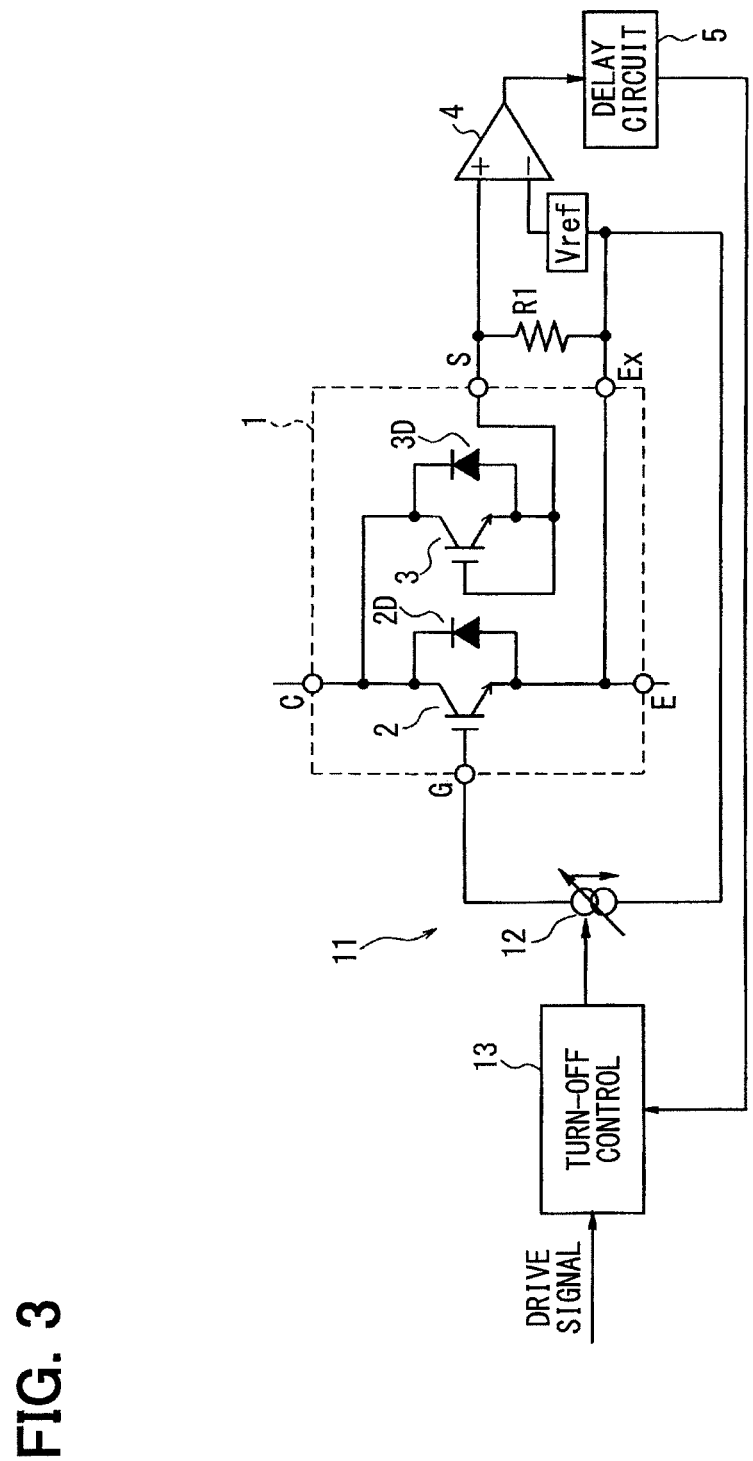
FIG. 3 is a diagram illustrating a semiconductor element module and a gate drive circuit according to a second embodiment of the present disclosure.

A semiconductor element module 1 and a gate drive circuit 11 according to a second embodiment of the present disclosure will be described with reference to FIG. 3. As illustrated in FIG. 3, the gate drive circuit 11 according to the present embodiment includes a variable constant current source 12 instead of the series circuit of the resistance element R2 and the switch 7 and the series circuit of the resistance element R3 and the switch 8. The variable constant current source 12 can work as a switching speed changeable section.

In addition, a turn-off control portion 13 replaces the turn-off control portion 6. The turn-off control portion 13 can work as a switching speed control section. When the drive signal of the driving element 2 is at the low level and the output voltage of the comparator 4 is at the high level, the turn-off control portion 13 transmits an output signal, for example, at the low level. At this time, a constant current value supplied from the variable constant current source 12 is set to be large. Thus, the gate of the driving element 2 is rapidly discharged, and the switching speed is relatively high. When the drive signal is at the low level and the output voltage of the comparator 4 is at the low level, the turn-off control portion 13 transmits the output signal at the high level. At this time, a constant current value supplied from the variable constant current source 12 is set to be small. Thus, the gate of the driving element 2 is gradually discharged, and the switching speed is relatively low.

According to the second embodiment, the gate drive circuit 11 changes the switching speed of turning-off the driving element 2 by changing the constant current value supplied from the variable constant current source 12. Thus, effects similar to the effects of the first embodiment can be obtained.

(Third Embodiment)

Figure 4:
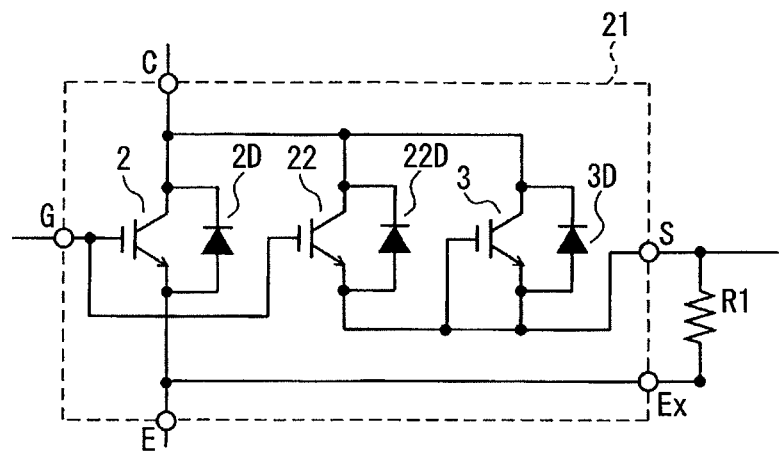
FIG. 4 is a diagram illustrating a semiconductor element module according to a third embodiment of the present disclosure.

A semiconductor element module 21 according to a third embodiment of the present disclosure will be described with reference to FIG. 4. The semiconductor element module 21 corresponds to the semiconductor element module 1 added with a current sensing element 22. The current sensing element 22 can works as a current detecting element. The current sensing element 22 is connected in parallel with the voltage change sensing element 3. A gate of the current sensing element 22 is connected to the gate of the driving element 2. Some semiconductor element modules incorporating IGBTs include current sensing elements for detecting collector currents that flow in the IGBTs as driving elements. A collector current that flows in a general current sensing element is about one several-thousandth of a collector current that flows in a driving current. The current sensing element 22 according to the present embodiment has a configuration similar to the general current sensing element.

In a semiconductor element module including a current sensing element, a detecting terminal S is provided as a terminal for detecting an electric current that flows to a driving element through the current sensing element. Thus, the semiconductor element module 21 has a configuration in which the voltage change sensing element 3 is added to the general semiconductor element module.

Either the gate drive circuit 9 according to the first embodiment or the gate drive circuit 11 according to the second embodiment may be connected to the semiconductor element module 21. However, a general circuit for detecting overcurrent is separately required. Because an overcurrent detection using the terminal voltage of the resistance element R1 is performed during the turn-on period of the driving element 2, the overcurrent detection can be performed separately from the gate voltage control during the turn-off period.

FIG. 5 is a diagram illustrating simulation results of the voltage VGE between the gate and the emitter, the voltage VCE between the collector and the emitter, and the voltage VSE between the sensing terminal S and the emitter when the driving element 2 in the semiconductor element module 1 is turned off. In the middle of changing the gate voltage VGE from the high level to the low level, after the waveform of the voltage VGE becomes flat in a mirror region, the driving element 2 starts to be turned off, the voltage VCE increases to the power supply voltage of the collector. The waveform of the voltage VCE does not reflect a generation of a surge voltage.

In a case where the voltage change sensing element 3 is not present, while the driving element 2 is in on in the process of increasing the voltage VCE, because almost constant current flows to the resistance element R1 through the current sensing element 22, the voltage VSE is consistently flat as shown by a solid line. On the other hand, in a case where the voltage change sensing element 3 is present, a current flowing through the voltage change sensing element 3 is superimposed on the resistance element R1. As a result, as shown by a dashed line, the level of the voltage VSE increases in a pulse manner. Thus, when the reference voltage Vref is set to a value within an increasing amount of the voltage VSE, a change of the voltage VCE can be detected.

As described above, according to the third embodiment, the semiconductor element module 21 includes the current sensing element 22. The collector and the gate of the current sensing element 22 are respectively connected to the collector and the gate of the driving element 2, and the emitter of the current sensing element 22 is connected to the detecting terminal S. In this case, the voltage change sensing element 3 is added to the semiconductor element module including the current sensing element 22. Thus, the change of the voltage VCE can be detected using the terminal S, which is already provided for current detection.

In addition, because the current sensing element 22 is present, while the driving element 2 is on, almost constant current flows to the resistance element R1, and the voltage between the terminals of the resistance element R1 has an almost constant level. This is a state where a surge voltage is likely to be generated when the driving element 2 is turned off. Then, when the driving element 2 is turned off, the voltage corresponding to the electric current flowing through the voltage change sensing element 3 is added to the above-described level. Thus, the change of the voltage VCE can be rapidly detected, and the switching speed can be changed more rapidly.

(Fourth Embodiment)

Figure 6:
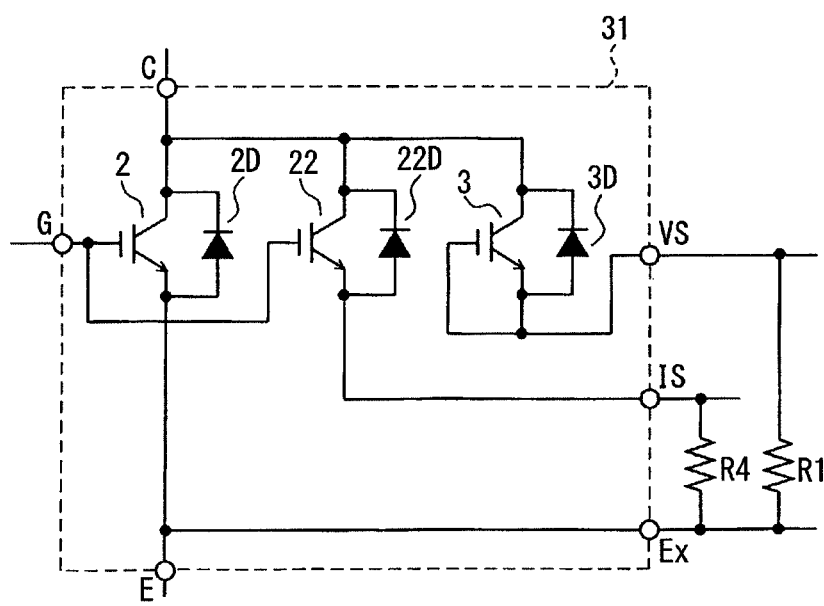
FIG. 6 is a diagram illustrating a semiconductor element module according to a fourth embodiment of the present disclosure.

A semiconductor element module 31 according to a fourth embodiment of the present disclosure will be described with reference to FIG. 6. The semiconductor element module 31 includes the current sensing element 22 similarly to the semiconductor element module 21 according to the third embodiment. However, the emitter of the current sensing element 22 is not connected in common with the emitter of the voltage change sensing element 3. The emitter of the voltage change sensing element 3 is connected to an external terminal VS, which can work as a detecting terminal. The emitter of the current sensing element 22 is connected to an external terminal IS that is provided separately from the external terminal VS. Between the terminals Is and Ex, a resistance element R4 for current detection is connected.

In other words, the terminal IS for detecting the electric current by the current sensing element 22 and the terminal VS for detecting the change of the voltage VCE by the voltage change sensing element 3 are separated. If both terminals are integrated as described in the third embodiment, the change of the voltage VCE can be detected more rapidly. However, in the above-described case, the reference voltage Vref applied to the comparator 4 has to be set in view of the voltage difference of each state. On the other hand, when the terminal VS is separated from the terminal IS as described in the fourth embodiment, because a normal potential of the terminal VS is zero, the reference voltage Vref can be set easily. In addition, the resistance values of the resistance elements R1, R4 can be selected more easily.

(Fifth Embodiment)

Figure 7:
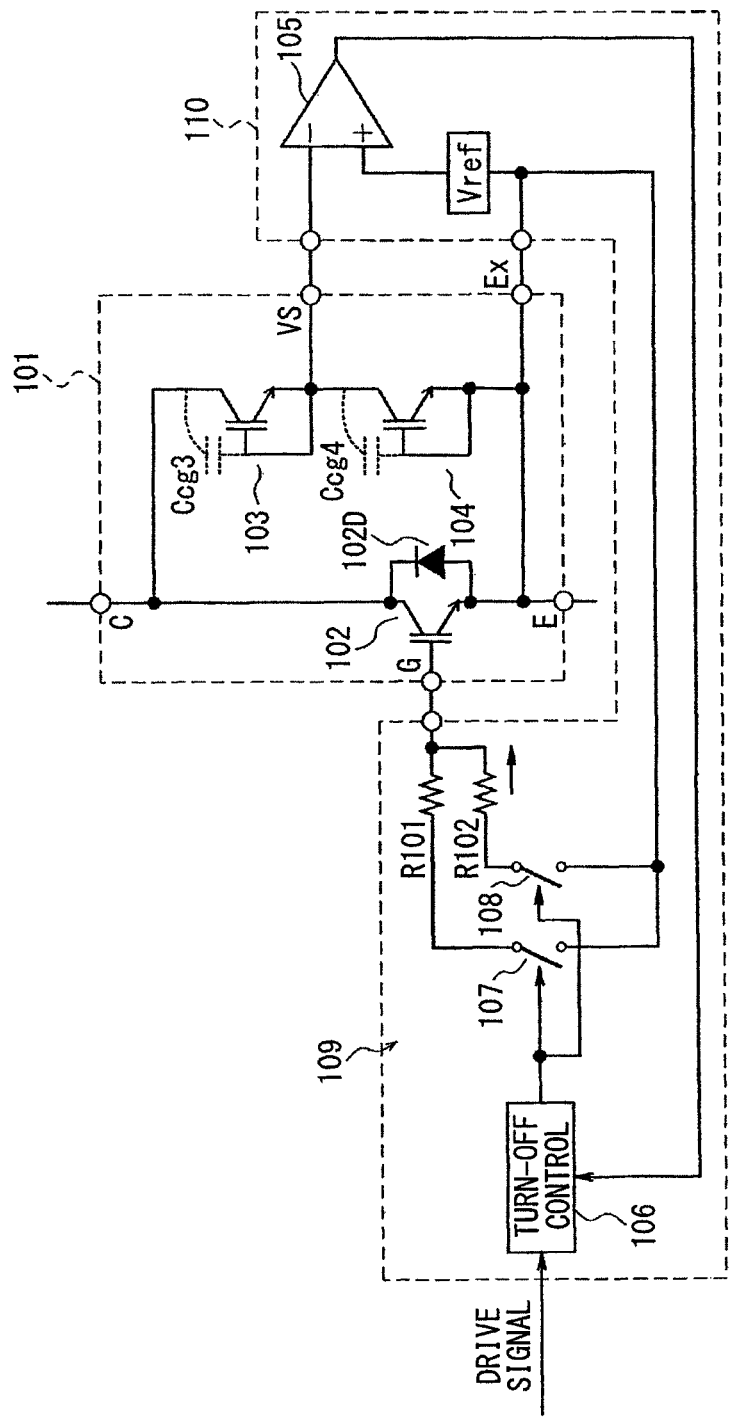
FIG. 7 is a diagram illustrating a semiconductor element module and a gate drive circuit according to a fifth embodiment of the present disclosure.

A semiconductor element module 101 and a gate drive circuit 109 according to a fifth embodiment of the present disclosure will be described with reference to FIG. 7. The semiconductor element module 101 includes a driving element 102 and voltage change sensing elements 103, 104. The voltage change sensing elements 103, 104 can work as voltage change detecting elements. The driving element 102 and the voltage change sensing elements 103, 104 are formed of, for example, IGBTs and are formed in the same process on the same semiconductor chip (semiconductor substrate) to form an IC chip (see FIG. 9A and FIG. 9B). The voltage change sensing elements 103, 104 have dimensions smaller than the driving element 102. Between a collector and an emitter of the driving element 102, a free wheel diode 102D is connected.

A gate (conductive control terminal), the collector (conductive terminal), and the emitter (reference potential side conductive terminal) of the driving element 102 are respectively connected to external terminals G, C, E of the semiconductor element module 101. The voltage change sensing elements 103, 104 are connected in series. A collector of the voltage change sensing element 103 is connected to the external terminal C. A gate and an emitter of the voltage change sensing element 103 are connected to an external terminal VS (detecting terminal) of the semiconductor element module 101. A gate and an emitter of the voltage change sensing element 104 are connected to the external terminal E of the semiconductor element module 101.

The external terminal VS is connected to an inverting input terminal of a comparator 105. A non-inverting input terminal of the comparator 105 is applied with a reference voltage Vref. A reference potential of the reference voltage Vref is the external terminal Ex (circuit ground). The external terminal Ex is connected to the external terminal E in the semiconductor element module 101. Thus, it is not always necessary to provide the external terminal Ex independently.

An output terminal of the comparator 105 is connected to an input terminal of a turn-off control portion 106. The turn-off control portion 106 can work as a switching speed control section. Between the external terminal G and the external terminal Ex of the semiconductor element module 101, a series circuit of a resistance element R101 and a switch 107 and a series circuit of a resistance element R102 and a switch 108 are connected in parallel with each other. The series circuit of the resistance element R101 and the switch 107 and the series circuit of the resistance element R102 and the switch 108 can work as a switching speed changeable section.

The turn-off control portion 106 receives a drive signal (gate control signal) of the driving element 102. When the drive signal is at a low level and an output voltage of the comparator 105 is at a high level, the switch 107 and the switch 108 are turned on at the same time. When the drive signal is at the low level and the output voltage of the comparator 105 is at the low level, only the switch 107 is turned on. The above-described components except for the semiconductor element module 101 form the gate drive circuit 109. The gate drive circuit 109 is formed by mounting the components on a control substrate 110. In the gate drive circuit 109, only components for turning off the driving element 102 are illustrated. When turning on the driving element 102, a high level signal is applied to the external terminal G through a signal path, which is not illustrated. At this time, both of the switches 7, 8 are turned off.

Figure 9A:
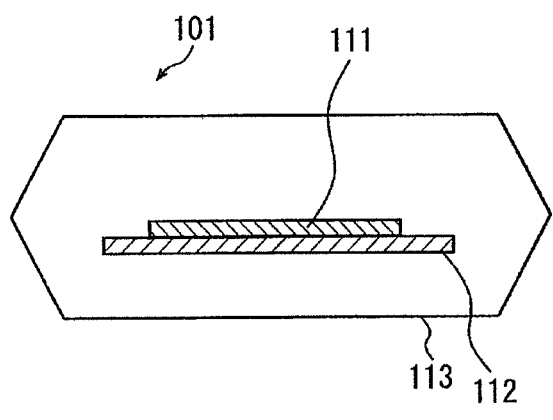
FIG. 9A is a cross-sectional view of a package configuration according to the fifth embodiment.
Figure 9B:
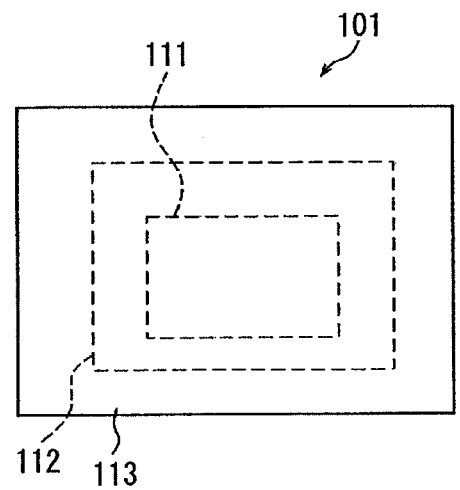
FIG. 9B is a plan view of the package configuration according to the fifth embodiment.

The driving element 102 and the voltage change sensing elements 103, 104 are formed in a semiconductor chip 111. The semiconductor chip 111 is an example of a semiconductor substrate. As illustrated in FIG. 9A and FIG. 9B, the semiconductor chip 111, the driving element 102, and the voltage change sensing elements 103, 104 are sealed with a mold resin 113 into one package in a state where the semiconductor chip 111 is mounted on a lead frame 112. Accordingly, one-package IC is formed.

Figure 8:
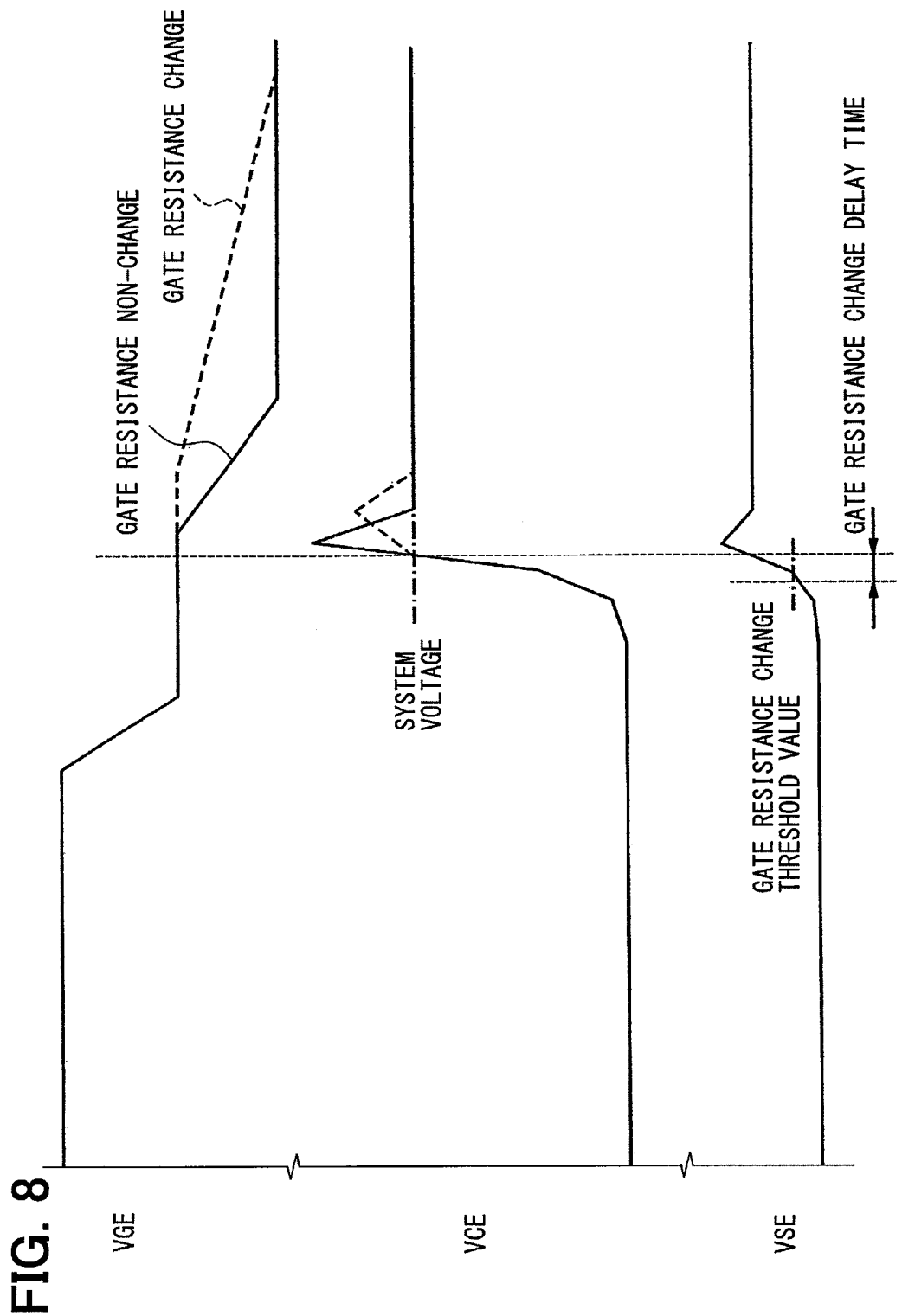
FIG. 8 is a timing diagram illustrating voltage waveforms when a driving element is turned off.

Next, an operation of the semiconductor element module 101 will be described with reference to FIG. 8. FIG. 8 shows a voltage VGE between the gate and the emitter, a voltage VCE between the collector and the emitter, and a voltage VSE between the sensing terminal S and the emitter when the driving element 102 in the semiconductor element module 101 is turned off. In the middle of changing the voltage VGE from a high level to a low level, a waveform the voltage VGE becomes almost flat in a minor region. After that, the driving element 102 starts to be turned off, the voltage VCE increases, and finally, the voltage VCE reaches a power supply voltage (system voltage) applied to the collector.

In the above-described process, if the parallel circuit of the resistance elements R101, R102 is consistently connected between the terminals G, Ex of the semiconductor element module 101, the voltage VCE changes as shown by the solid line. Then, when the driving element 102 is completely turned off, a surge voltage is generated at the collector by an inductance component.

On the other hand, in a process of increasing the voltage VCE by the gate drive circuit 109, a positive voltage change (dv/dt) is generated between the collector and the emitter. As illustrated in FIG. 7, between the collector and the gate of each of the voltage change sensing elements 103, 104, a parasitic capacitance Ccg3, Ccg4 is present. Although it is not illustrated, a parasitic capacitance is also present between the collector and the emitter. Thus, by the above-described voltage change, electric current flows between the external terminals C and E (and Ex) through the parasitic capacitances Ccg3, Ccg4. At this time, the voltage VCE is divided by the parasitic capacitances Ccg3, Ccg4. Thus, the voltage VSE at the terminal VS becomes a lower level.

When the voltage VSE increases and exceeds the reference voltage Vref, the output voltage of the comparator 105 changes to the low level, and the turn-off control portion 106 turns off the switch 108. Thus, after that, the gate of the driving element 102 is discharged only through the resistance element R101.

In other words, a resistance value of path for discharging the gate increases in the process of turning off the driving element 102, and the switching speed decreases. Due to the above-described action, a gradient of decrease of the voltage VGE becomes gentle, and a change of the voltage VCE is moderated, and an amplitude of the surge voltage is reduced as shown by a dashed line. A gate resistance change delay time shown in FIG. 8 is set in consideration of a time for effectively restricting the surge voltage by switching the gate resistance value just before the voltage VCE reaches the power supply voltage after the output voltage of the comparator 105 changes to the low level. If necessary, the gate resistance change delay time may be controlled using a delay circuit.

As described above, in the semiconductor element module 101 according to the present embodiment, the voltage change sensing elements 103, 104 are provided for detecting a change of the voltage between the collector and the emitter of the driving element 102. The gate of each of the voltage change sensing elements 103, 104 is connected to the emitter of each of the voltage change sensing elements 103, 104. The voltage change sensing elements 103, 104 are connected in series to form a series circuit. The series circuit is connected in parallel with the driving element 102. A common connection point in the series circuit is used as a detecting terminal VS for detecting a change of the voltage between the collector and the emitter of the driving element 102.

Accordingly, when the gate voltage is reduced, the driving element 102 starts to be turned off, the voltage between the collector and the emitter increases, and a positive voltage change (dv/dt) is generated between the collector and the emitter. Due to the voltage change, electric current flows between the both terminals through the parasitic capacitance between the collector and the gate and the parasitic capacitance between the collector and emitter of each of the voltage change sensing elements 103, 104.

At the common connection point in the series circuit of the voltage change sensing elements 103, 104, a potential obtained by dividing the voltage between the collector and the emitter of the driving element 102 by the parasitic capacitances Ccg3 and Ccg4 appears. Thus, when the change of the voltage at the common connection point is monitored, the change of the voltage between the collector and the emitter in the process of turning off the driving element 102 can be rapidly detected as a divided low voltage. A manufacturing variation between the parasitic capacitances Ccg3 and Ccg4 is small, and temperature characteristics of the parasitic capacitances Ccg3 and Ccg4 are equal to each other. Thus, the voltage between the collector and the emitter can be always detected with a high accuracy. When the gate voltage of the driving element 102 is changed in accordance with the change of the voltage between the collector and the emitter, a surge voltage generated at the collector when the driving element 102 is turned off can be certainly reduced. Furthermore, because the gate of each of the voltage change sensing elements 103, 104 is connected to the emitter of each of the voltage change sensing elements 103, 104, the voltage change sensing elements 103, 104 are certainly restricted from being turned on in the process of turning off the driving element 102.

In addition, because the driving element 102 and the voltage change sensing elements 103, 104 are formed on the same semiconductor chip 111 and are formed into one package with the mold resin 113, one body of the semiconductor element module 101 including the voltage change sensing elements 103, 104 can be easily treated.

At a time when the driving element 102 starts to be turned off, the turn-off control portion 106 in the gate drive circuit 109 decreases the gate resistance value to increase the switching speed. When the turn-off control portion 106 detects that the voltage of the detecting terminal VS changes while the driving element 102 is turned off, the turn-off control portion 106 increases the gate resistance value to decrease the switching speed. Accordingly, the switching speed can be reduced while the driving element 102 is turned off, and the surge voltage can be reduced.

(Sixth Embodiment)

Figure 10A:
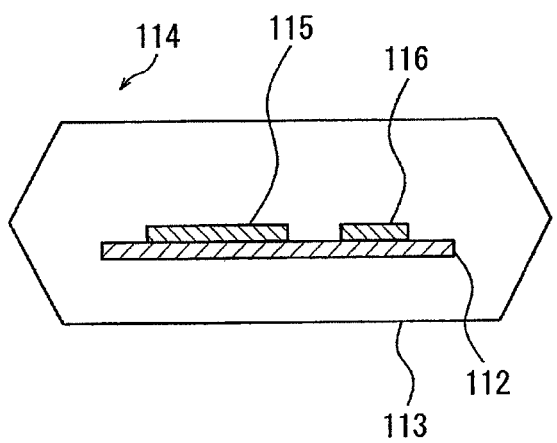
FIG. 10A is a cross-sectional view of a package configuration according to a sixth embodiment of the present disclosure.
Figure 10B:
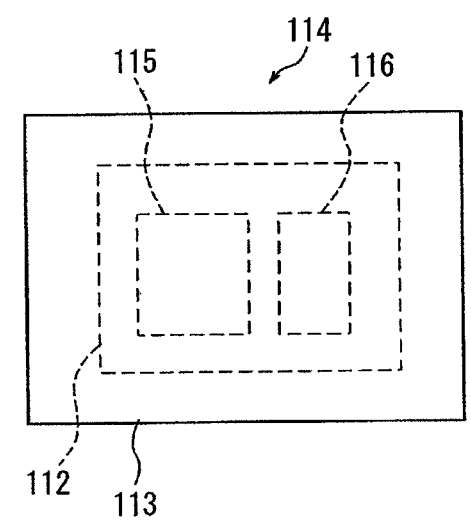
FIG. 10B is a plan view of the package configuration according to the sixth embodiment.

A semiconductor element module 114 according to a sixth embodiment of the present disclosure will be described with reference to FIG. 10A and FIG. 10B. In the semiconductor element module 114 according to the present embodiment, the driving element 102 is formed on a semiconductor chip 115, and the voltage change sensing elements 103, 104 are formed on a semiconductor chip 116 that is different from the semiconductor chip 115. The semiconductor ship 115 is an example of a first semiconductor substrate and the semiconductor chip 116 is an example of a second semiconductor substrate. The semiconductor element module 114 is formed into one package with a mold resin 113. In other words, the mold resin 113 seals the semiconductor chips 115, 116, the driving element 102, and the voltage change sensing elements 103, 104 into one package. Also in the present embodiment having the above-described configuration, effects similar to the fifth embodiment can be obtained.

(Seventh Embodiment)

Figure 11:
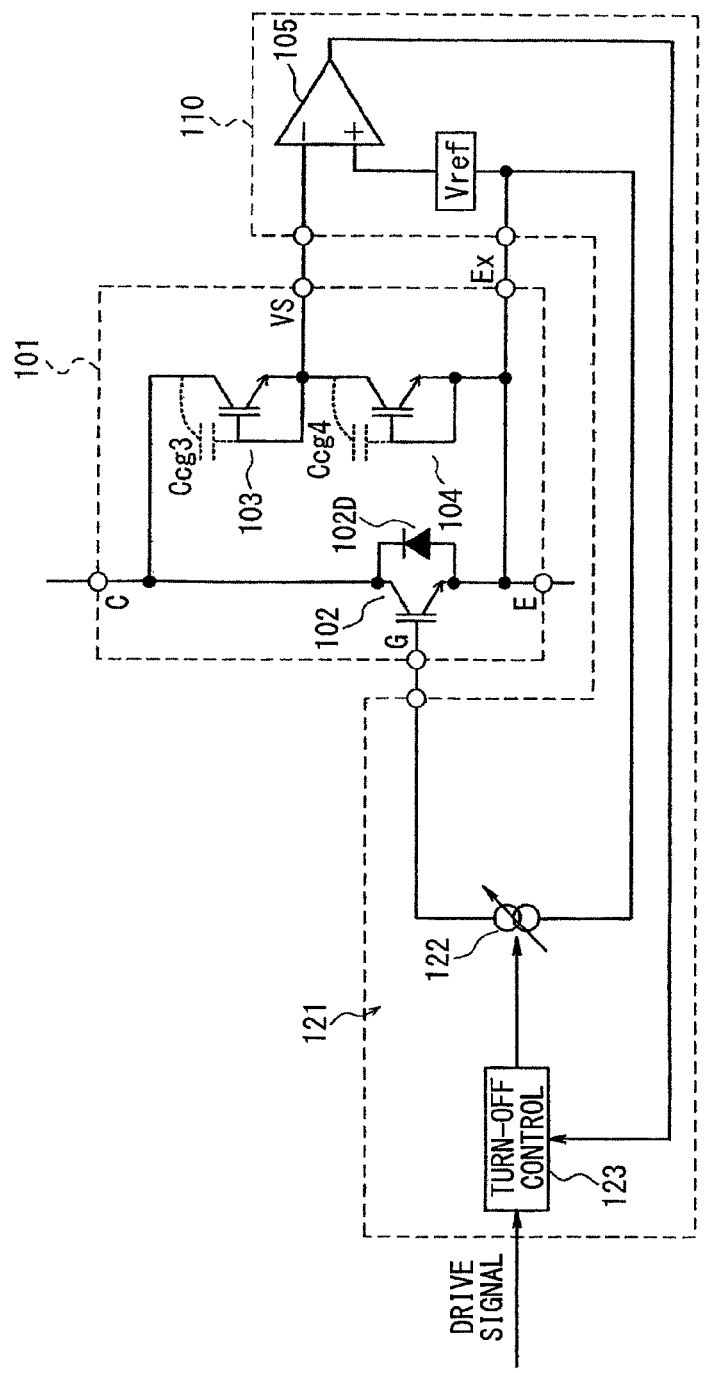
FIG. 11 is a diagram illustrating a semiconductor element module and a gate drive circuit according to a seventh embodiment of the present disclosure.

A gate drive circuit 121 according to a seventh embodiment of the present disclosure will be described with reference to FIG. 11. As illustrated in FIG. 11, the gate drive circuit 121 according to the present embodiment includes a variable constant current source 122 instead of the series circuit of the resistance element R101 and the switch 107 and the series circuit of the resistance element R102 and the switch 108. The variable constant current source 122 can work as a switching speed changeable section.

In addition, a turn-off control portion 123 replaces the turn-off control portion 106. The turn-off control portion 123 can work as a switching speed control section. When the drive signal of the driving element 102 is at the low level and the output voltage of the comparator 105 is at the high level, the turn-off control portion 123 transmits an output signal, for example, at the low level. At this time, a constant current value supplied from the variable constant current source 122 is set to be large. Thus, the gate of the driving element 102 is rapidly discharged, and the switching speed is relatively high. When the drive signal is at the low level and the output voltage of the comparator 105 is at the low level, the turn-off control portion 123 transmits the output signal at the high level. At this time, a constant current value supplied from the variable constant current source 122 is set to be small. Thus, the gate of the driving element 102 is gradually discharged, and the switching speed is relatively low.

According to the seventh embodiment, the gate drive circuit 121 changes the switching speed of turning-off the driving element 102 by changing the constant current value supplied from the variable constant current source 122. Thus, effects similar to the effects of the fifth embodiment can be obtained.

(Eighth Embodiment)

Figure 12:
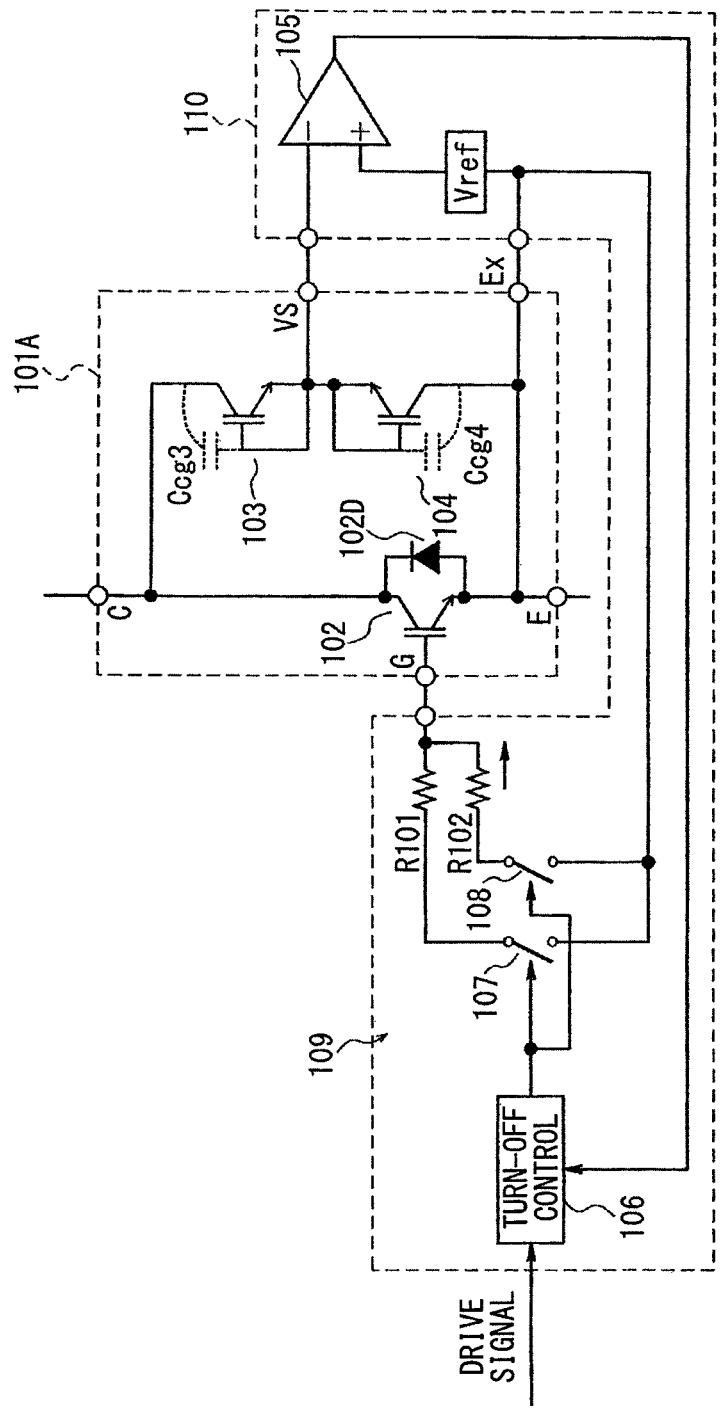
FIG. 12 is a diagram illustrating a semiconductor element module and a gate drive circuit according to an eighth embodiment of the present disclosure.

A semiconductor element module 101A according to an eighth embodiment of the present disclosure will be described with reference to FIG. 12. In the semiconductor element module 101A according to the present embodiment, the emitter of the voltage change sensing element 104 is connected to the emitter of the voltage change sensing element 103, and the collector of the voltage change sensing element 104 is connected to the external terminal E. Also in the present embodiment having the above-described configuration, effects similar to the fifth embodiment can be obtained.

(Ninth Embodiment)

Figure 13:
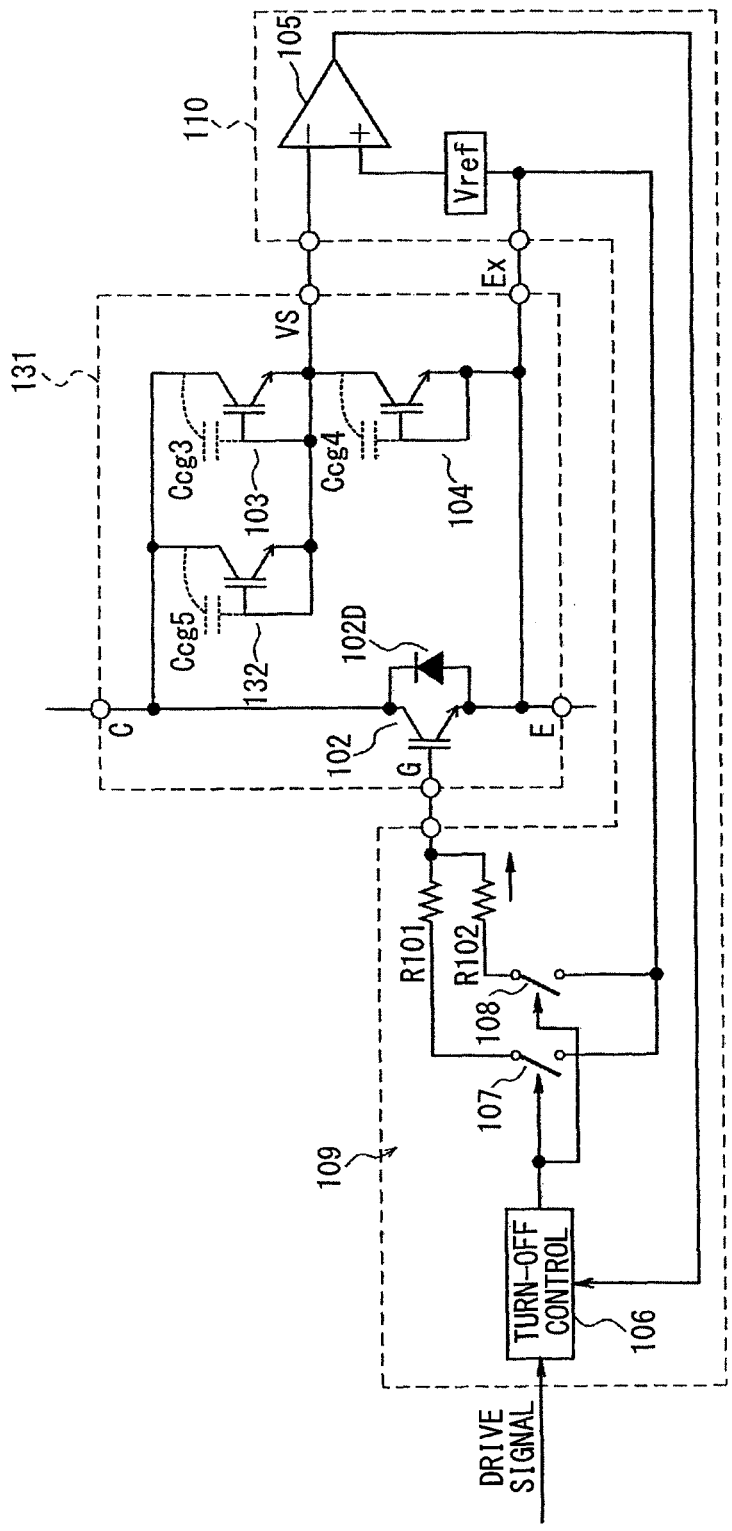
FIG. 13 is a diagram illustrating a semiconductor element module and a gate drive circuit according to a ninth embodiment of the present disclosure.

A semiconductor element module 131 according to a ninth embodiment of the present disclosure will be described with reference to FIG. 13. In the semiconductor element module 131, a voltage change sensing element 132 is connected in parallel with the voltage change sensing element 103. Also in the present embodiment having the above-described configuration, effects similar to the fifth embodiment can be obtained.

(Tenth Embodiment)

Figure 14:
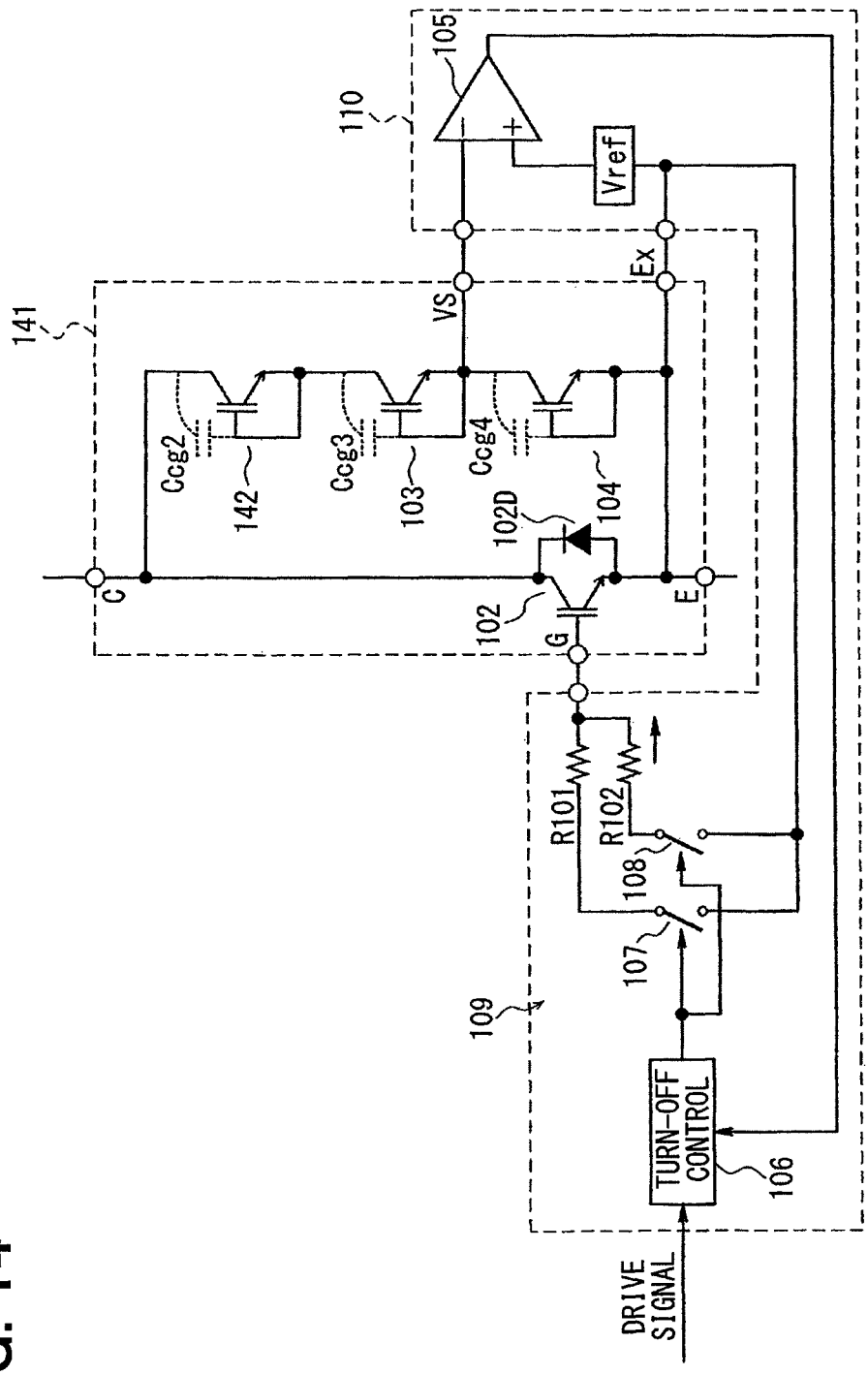
FIG. 14 is a diagram illustrating a semiconductor element module and a gate drive circuit according to a tenth embodiment of the present disclosure.

A semiconductor element module 141 according to a tenth embodiment of the present disclosure will be described with reference to FIG. 14. In the semiconductor element module 141, a voltage sensing element 142 is connected between the collector of the driving element 102 and the collector of the voltage change sensing element 103 so as to form a three-series configuration. According to the tenth embodiment, the voltage between the collector and the emitter of the driving element 102 can be divided into a lower potential.

(Eleventh Embodiment)

Figure 15:
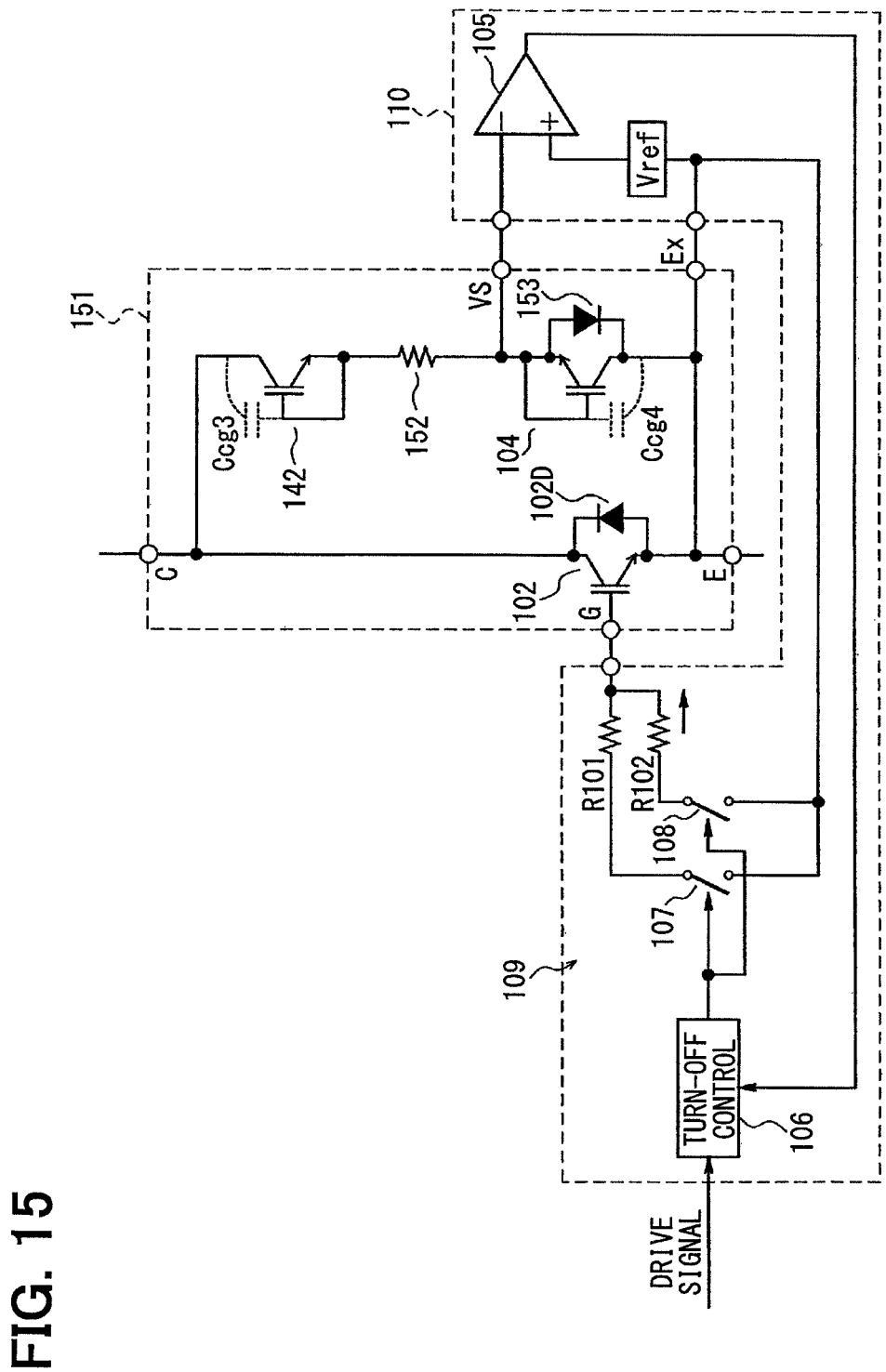
FIG. 15 is a diagram illustrating a semiconductor element module and a gate drive circuit according to an eleventh embodiment of the present disclosure.

A semiconductor element module 151 according to an eleventh embodiment of the present disclosure will be described with reference to FIG. 15. The semiconductor element module 151 is different from the semiconductor element module 101A according to the eighth embodiment in that a resistance element 152 is connected between the emitter of the voltage change sensing element 103 and the emitter of the voltage change sensing element 104. In addition, a diode 153 is connected between the emitter and the collector of the voltage change sensing element 104. According to the present embodiment, even when the parasitic capacitance Ccg3 breaks down, the resistance element 152 can protect components such as the comparator 105.

(Twelfth Embodiment)

Figure 16:
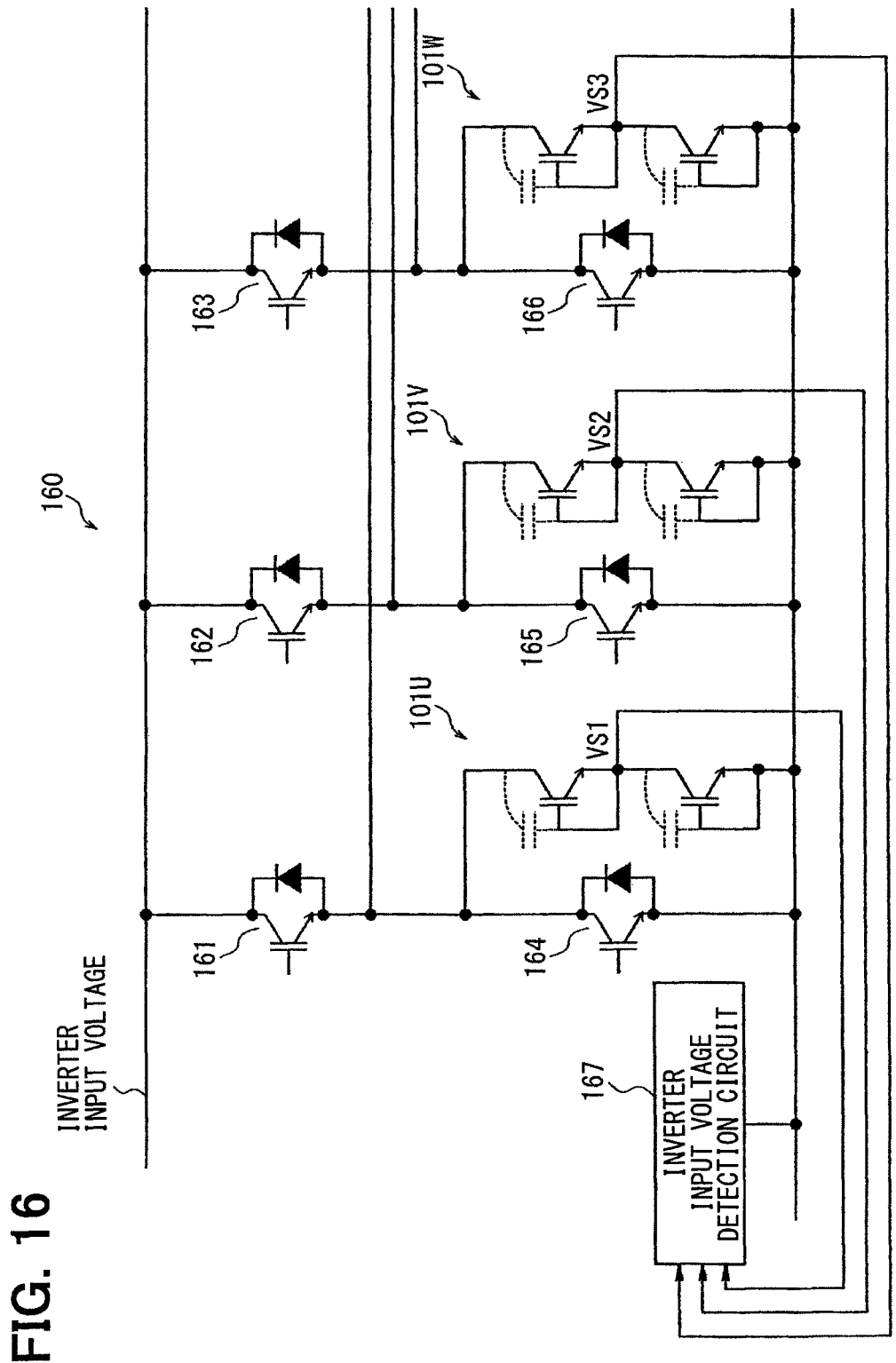
FIG. 16 is a diagram illustrating an example according to a twelfth embodiment of the present disclosure in which semiconductor element modules are applied to an input voltage detection in an inverter circuit.

An inverter circuit 160 according to a twelfth embodiment of the present disclosure will be described with reference to FIG. 16. The inverter circuit 160 includes six switching elements 161-166 connected in a three-phase bridge connection. Each of the switching elements 161-166 is formed of, for example, an IGBT. Semiconductor element modules 101U, 101V, 101W are respectively connected in parallel with the switching elements 164, 165, 166 disposed on a negative side. Each of the semiconductor element modules 101U, 101V, 101W is, for example, the semiconductor element module 101 according to the fifth embodiment.

Each of external terminals VS1, VS2, VS3 of the semiconductor element modules 101U, 101V, 101W is connected to an input terminal of an inverter input voltage detection circuit 167. While the switching elements 161-163 disposed on a positive side are on, an input voltage is applied to the switching elements 164-166 disposed on the negative side. Thus, the inverter input voltage detection circuit 167 can detect the input voltage divided by the semiconductor element modules 101U, 101V, 101W during the on-period.

(Other Embodiments)

The present disclosure is not limited only to the embodiments described above or described in the drawings, and the following modification or expansion is possible.

The voltage driving semiconductor element is not limited to the IGBT and may be other element such as a MOSFET.

In the first embodiment, the resistance value of the resistance element R2 may be set to be low and the resistance value of the resistance element R3 may be set to be high. Then, at a start of turning-off, only the resistance element R2 may be connected, and the connection may be changed to the resistance element R3 in the middle of turning-off operation.

In the fifth embodiment, the resistance value of the resistance element R101 may be set to be low and the resistance value of the resistance element R102 may be set to be high. Then, at a start of turning-off, only the resistance element R101 may be connected, and the connection may be changed to the resistance element R102 in the middle of turning-off operation.

The package configuration according to the sixth embodiment, or the gate drive circuit 121 according to the seventh embodiment may be used for the seventh though eleventh embodiments.

In the ninth embodiment, the voltage change sensing element 132 may be connected in parallel with the voltage change sensing element 104. The voltage change sensing element 132 is connected in parallel with each of the voltage change sensing elements 103, 104.

Similarly to the twelfth embodiment, an input voltage of a half bridge circuit or an H bridge circuit may be detected.

What is claimed is:

1. A semiconductor element module comprising:
    a driving element formed of a voltage driving semiconductor element; and
    a voltage change detecting element formed of a voltage driving semiconductor element and detecting a change of a voltage between a collector and an emitter or between a drain and a source of the driving element, wherein
    a collector or a drain of the voltage change detecting element is connected to the collector or the drain of the driving element, and a gate of the voltage change detecting element is connected to an emitter or a source of the voltage change detecting element without connecting through the driving element, and
    the emitter or the source of the voltage change detecting element is provided as a detecting terminal.

2. The semiconductor element module according to claim 1, further comprising
    a current detecting element formed of a voltage driving semiconductor element, wherein
    a collector or a drain and a gate of the current detecting element are respectively connected to the collector or the drain and the gate of the driving element, and an emitter or a source of the current detecting element is connected to the detecting terminal.

3. The semiconductor element module according to claim 1, further comprising
    a current detecting element formed of a voltage driving semiconductor element, wherein
    a collector or a drain and a gate of the current detecting element are respectively connected to the collector or the drain and the gate of the driving element, and an emitter or a source of the current detecting element is connected to a current detecting terminal, and
    the gate of the voltage change detecting element is connected to the emitter or the source of the voltage change detecting element without connecting through the current detecting element.

4. A gate drive circuit to be connected with the semiconductor element module according to claim 1 and to transmit a drive signal to the gate of the driving element, the gate drive circuit comprising:
    a detecting resistor to be connected between the detecting terminal and the emitter or the source of the driving element;
    a switching speed changeable section capable of changing a switching speed of the driving element; and
    a switching speed control section controlling the switching speed changeable section to set the switching speed to be high when a turning-off of the driving element is started and to set the switching speed to be low when a change of a terminal voltage of the detecting resistance element is detected.

5. The gate drive circuit according to claim 4, wherein
    the switching speed changeable section changes the switching speed by changing a gate resistance value of the driving element.

6. The gate drive circuit according to claim 4, wherein
    the switching speed changeable section changes the switching speed by changing an electric current amount for discharging the gate of the driving element.

* * * * *